United States Patent
Thompson et al.

(10) Patent No.: US 9,971,008 B2
(45) Date of Patent: May 15, 2018

(54) MRI GRADIENT TRAJECTORY MAPPING

(71) Applicant: TOSHIBA MEDICAL SYSTEMS CORPORATION, Tochigi (JP)

(72) Inventors: Michael R. Thompson, Cleveland Heights, OH (US); Andrew J. Wheaton, Shaker Heights, OH (US)

(73) Assignee: TOSHIBA MEDICAL SYSTEMS CORPORATION, Otawara-Shi, Tochigi-Ken (JP)

(*) Notice: Subject to any disclaimer, the term of this patent is extended or adjusted under 35 U.S.C. 154(b) by 547 days.

(21) Appl. No.: 14/502,021

(22) Filed: Sep. 30, 2014

(65) Prior Publication Data

US 2016/0091582 A1 Mar. 31, 2016

(51) Int. Cl.
G01R 33/56 (2006.01)
G01R 33/565 (2006.01)

(52) U.S. Cl.
CPC .............. G01R 33/56518 (2013.01)

(58) Field of Classification Search
CPC .......... G01R 33/56572; G01R 33/3854; G01R 33/385; G01R 33/54; G01R 33/56518; G01R 33/56563
See application file for complete search history.

(56) References Cited

U.S. PATENT DOCUMENTS

| | | | |
|---|---|---|---|
| 6,025,715 A | 2/2000 | King et al. | |
| 7,132,826 B1* | 11/2006 | Jung | G01R 33/4824 324/307 |
| 2004/0245986 A1* | 12/2004 | Kumai | G01R 33/565 324/307 |
| 2010/0272337 A1* | 10/2010 | Shirai | G01R 33/485 382/131 |
| 2011/0200243 A1* | 8/2011 | Takizawa | G01R 33/4824 382/131 |
| 2013/0200893 A1* | 8/2013 | Heismann | G01R 33/3854 324/314 |
| 2014/0111204 A1* | 4/2014 | Wu | A61B 5/055 324/309 |
| 2014/0232393 A1* | 8/2014 | Wheaton | G01R 33/24 324/309 |
| 2014/0306703 A1* | 10/2014 | Shirai | G01R 33/56518 324/309 |
| 2015/0008921 A1* | 1/2015 | Lee | G01R 33/56518 324/309 |

(Continued)

OTHER PUBLICATIONS

Addy, et al., "Simple Method for MR Gradient System Characterization and k-Space Trajectory Estimation," *Magnetic Resonance in Medicine*, vol. 68, pp. 120-129 (2012).

(Continued)

*Primary Examiner* — Clayton E Laballe
*Assistant Examiner* — Ruifeng Pu
(74) *Attorney, Agent, or Firm* — Nixon & Vanderhye P.C.

(57) ABSTRACT

Magnetic field temporal variations in magnetic resonance imaging (MRI) volume are determined based on the slope of a phase difference $\Delta\varphi$ between spin responses in plural slices at a given temporal sampling time. Representations of the determined temporal magnetic field variations are stored for subsequent use, e.g., to achieve more accurate re-gridding of acquired k-space date before reconstruction of images in the spatial domain.

22 Claims, 5 Drawing Sheets

(56) References Cited

U.S. PATENT DOCUMENTS

| | | | |
|---|---|---|---|
| 2015/0091565 A1* | 4/2015 | Grodzki | G01R 33/246 324/309 |
| 2015/0091567 A1* | 4/2015 | Grodzki | G01R 33/4818 324/309 |
| 2015/0253408 A1* | 9/2015 | Grodzki | G01R 33/307 324/309 |
| 2016/0178718 A1* | 6/2016 | Bindseil | G01R 33/385 324/322 |

OTHER PUBLICATIONS

Alley, et al., "Gradient Characterization Using a Fourier-Transform Technique," *Magnetic Resonance in Medicine*, vol. 39, pp. 581-587 (1998).

Atkinson, et al., "Characterization and Correction of System Delays and Eddy Currents for MR Imaging with Ultrashort Echo-Time and Time-Varying Gradients," *Magnetic Resonance in Medicine*, vol. 62, pp. 532-537 (2009).

Beaumont, et al., "Improved k-Space Trajectory Measurement With Signal Shifting," *Magnetic Resonance in Medicine*, vol. 58, pp. 200-205 (2007).

Liu, et al., "Quantitative Characterization of the Eddy Current Fields in a 40-cm Bore Superconducting Magnet," *Magnetic Resonance in Medicine*, vol. 31, pp. 73-76 (1994).

Lu, et al., "A Simple Approach to Measure and Correct for B0 and Linear Eddy Currents," *Proc. Intl. Soc. Mag. Resonance. Med.*, vol. 14, p. 2378 (2006).

Mason, et al., "A Method to Measure Arbitrary k-Space Trajectories for Rapid MR Imaging," *Magnetic Resonance in Medicine*, vol. 58, pp. 492-496 (1997).

Takahashi, et al., "Compensation of Multi-Dimensional Selective Excitation Pulses Using Measured k-Space Trajectories," *Magnetic Resonance in Medicine*, vol. 456, pp. 446-456 (1995).

Vannesjo, et al., "Gradient System Characterization by Impulse Response Measurements with a Dynamic Field Camera," *Magnetic Resonance in Medicine*, vol. 69, pp. 583-593 (2013).

Wysong, et al., "A Simple Method of Measuring Gradient Induced Eddy Currents to Set Compensation Networks," *Magnetic Resonance in Medicine*, vol. 29, pp. 119-121 (1993).

Zhang, et al., "A Novel k-Space Trajectory Measurement Technique," *Magnetic Resonance in Medicine*, vol. 39, pp. 999-1004 (1998).

* cited by examiner

MRI GRADIENT TRAJECTORY MAPPING

TECHNICAL FIELD

The subject matter below relates generally to magnetic resonance imaging (MRI). In particular, the subject matter relates to mapping the trajectory of NMR (nuclear magnetic resonance) spins in k-space in response to applied magnetic gradient fields.

DETAILED DESCRIPTION

Figure 1:
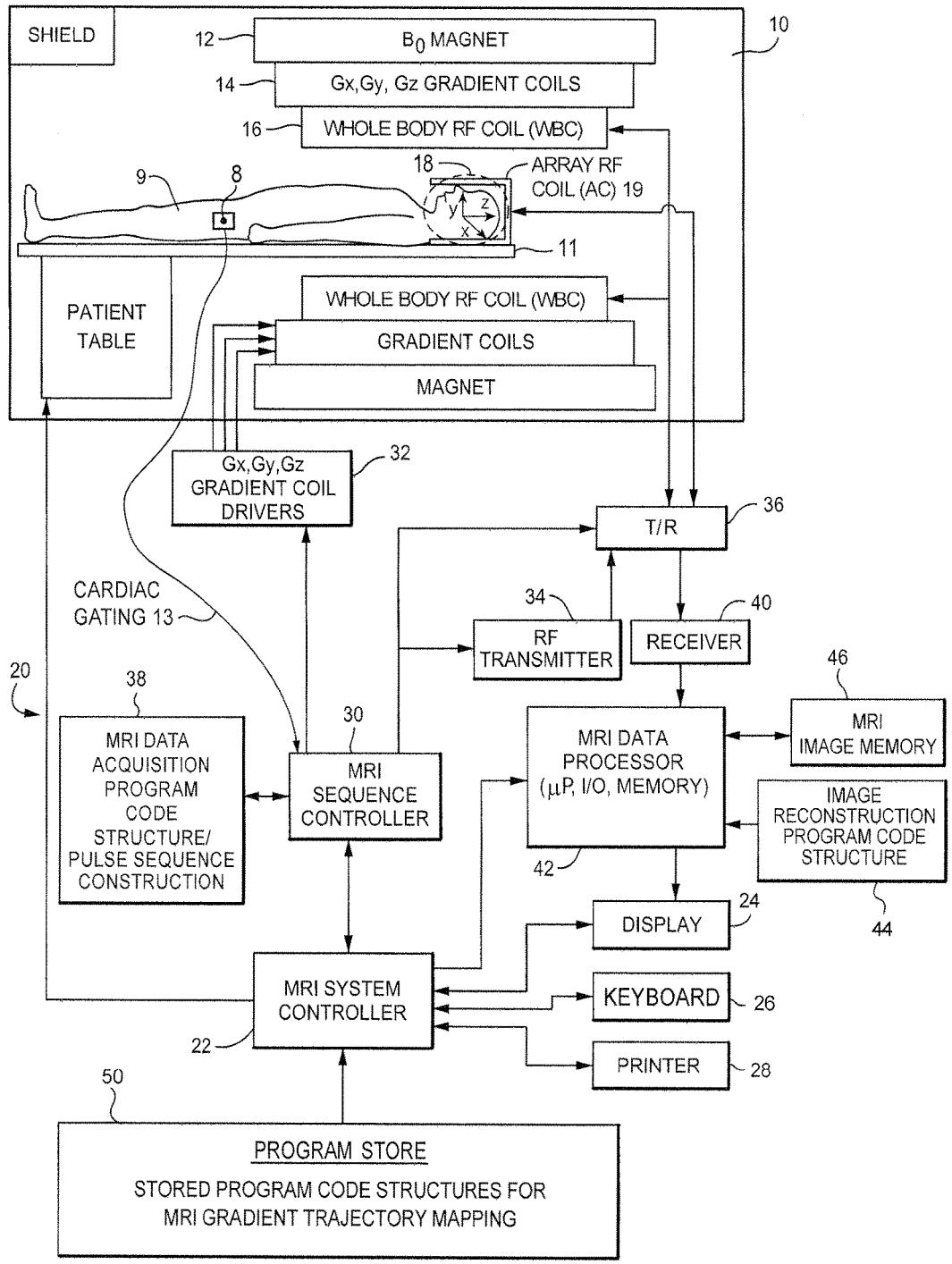
FIG. 1 is a high-level schematic block diagram of an MRI system adapted for MRI gradient trajectory mapping, in accordance with one or more embodiments.

The MRI system shown in FIG. 1 includes a gantry 10 (shown in schematic cross-section) and various related system components 20 interfaced therewith. At least the gantry 10 is typically located in a shielded room. The MRI system geometry depicted in FIG. 1 includes a substantially coaxial cylindrical arrangement of the static field $B_0$ magnet 12, a Gx, Gy and Gz gradient coil set 14 and a large whole body RF coil (WBC) assembly 16. Along the horizontal axis of this cylindrical array of elements is an imaging volume 18 shown as substantially encompassing the head of a patient 9 supported by a patient table 11. As will be understood, for some purposes a phantom object instead of human anatomy may be positioned at a desired location in the imaging volume 18. One or more smaller array RF coils 19 might be more closely coupled to the patient head in imaging volume 18. As those in the art will appreciate, compared to the WBC (whole body coil), relatively small coils and/or arrays such as surface coils or the like are often customized for particular body parts (e.g., arms, shoulders, elbows, wrists, knees, legs, chest, spine, etc.). Such smaller RF coils are herein referred to as array coils (AC) or phased array coils (PAC). These may include at least one coil configured to transmit RF signals into the imaging volume and a plurality of receiver coils configured to receive RF signals from an object, such as the patient head in the example above, in the imaging volume. A cardiac signal acquisition apparatus 8 (positioned as appropriate on the patient anatomy) may be used to provide peripheral pulsatile and/or cardiac gating signals 13 to trigger the MRI sequence controller 30.

An MRI system controller 22 has input/output ports connected to a display 24, keyboard 26 and printer 28. As will be appreciated, the display 24 may be of the touch-screen variety so that it provides control inputs as well and a mouse or other I/O device(s) may be provided.

The MRI system controller 22 interfaces with MRI sequence controller 30 which, in turn, controls the Gx, Gy and Gz gradient coil drivers 32, as well as the RF transmitter 34 and the transmit/receive switch 36 (if the same RF coil is used for both transmission and reception). The MRI sequence controller 30 includes suitable program code structure 38 for implementing MRI imaging (also known as nuclear magnetic resonance, or NMR, imaging) techniques, which may also include parallel imaging. As described below, sequence controller 30 may be configured to apply predetermined pulse sequences and/or pulse sequences formed in accordance with configuration parameters, in order to obtain NMR echo data ("echo data") from which a diagnostic MRI image is obtained. MRI sequence controller 30 may be configured to, using cardiac gating signals from cardiac signal acquisition device 8, transmit a pulse sequence towards an area of the patient in order to separately acquire echo data corresponding to a systole and a diastole, such that a difference image can be obtained. MRI sequence controller 30 may also be configured for echo planar (EPI) imaging and/or parallel imaging. Moreover, MRI sequence controller 30 may facilitate one or more preparation scan (prescan) sequences, and a scan sequence to obtain a main scan MR image (sometimes referred to as the diagnostic image).

The MRI system components 20 include an RF receiver 40 providing input to data processor 42 so as to create processed image data, which is sent to display 24. The MRI data processor 42 is also configured for access to previously generated MR data, images, and/or maps, and/or system configuration parameters 46, and MRI image reconstruction/subtraction program code structures 44 and 50.

Also illustrated in FIG. 1 is a generalized depiction of an MRI system program store 50 where stored program code structures (e.g., for image reconstruction, for MRI gradient trajectory mapping, for post-processing MRI, etc.) are stored in non-transitory computer-readable storage media accessible to the various data processing components of the MRI system. Program code may also be stored for obtaining operator input, including, for example, pulse sequence configurations including refocusing flip angle configurations for refocusing pulses in pulse sequences such as fast acquisition spin echo (FASE), TR interval settings, etc. As those in the art will appreciate, the program store 50 may be segmented and directly connected, at least in part, to different ones of the system components 20 processing computers having most immediate need for such stored program code structures in their normal operation (i.e., rather than being commonly stored and connected directly to the MRI system controller 22).

Indeed, as those in the art will appreciate, the FIG. 1 depiction is a very high-level simplified diagram of a typical MRI system with some modifications so as to practice exemplary embodiments described herein below. The system components can be divided into different logical collections of "boxes" and typically comprise numerous digital signal processors (DSP), microprocessors and special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an image reconstruction process and/or sometimes the generation of a subtracted image from control and tagging images, as described below, an array of computer-readable accessible data value storage sites in physical storage media will be transformed from some prior state (e.g., all uniform "zero" values or all "one" values) to a new state wherein the physical states at the physical sites of such an array vary between minimum and maximum values to represent real world physical events and conditions (e.g., the internal physical structures of a patient over an imaging volume space). As those in the art will appreciate, such arrays of stored data values represent and also constitute a physical structure—as does a particular structure of computer control program codes that, when sequentially loaded into instruction registers and executed by one or more CPUs of the MRI system components 20, causes a particular sequence of operational states to occur and be transitioned through within the MRI system.

The example embodiments described below measure time varying magnetic fields actually imposed on NMR spins such as by gradient magnetic field pulses and/or eddy current responses. Such data can be used to map the trajectory of NMR nuclei in k-space in response to gradient field magnetic pulses. The resulting stored representations of determined temporal magnetic field variations may be used for various purposes including more accurate re-gridding of k-space data prior to image reconstruction. The preferred embodiments do not require assumptions to be made about the shape of the applied gradient field pulse in the time domain but can provide temporal mapping resolution at the read-out sampling rate.

It is common practice to "re-grid" acquired k-space data in an attempt to account for the fact that some or all sample points are acquired non-uniformly in k-space. This may be due to intended non-uniformity (i.e., acquiring samples during gradient transitions) or unintended deviations (i.e., due to physical sources like eddy currents, miscalibration of the gradient system, or non-ideal gradient system performance). Such re-gridding cannot be accurately accomplished unless it is based on an accurate representation of temporal magnetic field variations applied to the NMR nuclei.

Methods to measure magnetic gradient fields have been previously addressed in the literature. For example:
Vannesjo et al., Magn Reson Med 69: 583-593 (2013), Gradient System Characterization by Impulse Response Measurements with a Dynamic Field Camera.
Addy et al., Magn Reson Med 68: 120-129 (2013), Simple Method for MR Gradient System Characterization and k-Space Trajectory Estimation.
Atkinson et al., Magn Reson Med 62:532-537 (2009), Characterization of System Delays and Eddy Currents for MR Imaging with Ultrashort Echo-Time and Time-Varying Gradients.
Beaumont et al., Magn Reson Med 58:200-205 (2007), Improved k-Space Trajectory Measurement with Signal Shifting.
King et al., U.S. Pat. No. 6,025,715 (2000), Method for Compensating an MRI System for a Time Dependent Gradient Field Distortion.
Zhang et al., Magn Reson Med 39:999-1004 (1998), A Novel k-Space Trajectory Measurement Technique.

It is well understood that there are deviations between the magnetic field gradient waveforms requested on a MRI scanner, and those magnetic field gradients that affect the spins. MRI system performance, in particular the performance of gradient amplifiers, can behave non-linearly as a function of different stress conditions. The gradient system can be stressed by temperature variations, mechanical vibrations, amplifier current and power duty cycle, and other sources. The end effect is that the physically imposed magnetic gradient field created by the system can be non-ideal. And the characteristics of the non-idealities can change depending on the set of stress conditions.

In short, gradient magnetic pulses in MRI sequences can be non-ideal due to physical (eddy currents) and/or hardware (amplifier non-linearity) sources. It would be best to directly measure the gradient pulse waveform being experienced by the NMR nuclei. Thus, tools for measuring the applied magnetic fields to characterize system performance are especially desirable.

Prior methods concentrate on characterization of these deviations for application to a priori imaging scenarios, require additional specialized hardware, or require data collected over a range of system outputs. The work proposed, herein, represents a robust measurement model to characterize an MRI system at specific sub-volumes of its operational space, without need for additional hardware. Exemplary dimensions of the operational space of an MRI scanner that may be studied include, but are not limited to, output gradient voltage, operational gradient frequency, physical location, and gradient duty cycle. An accurate model of gradient response for an MRI scanner over its entire operational envelope, as observed by the resulting NMR spins, is required to minimize image artifacts for all imaging techniques.

The example embodiment provides a method to directly measure magnetic gradient fields.
First assume that:
i=an ADC readout sample index and that
j=a slice, or Tx (transmitter) frequency offset step.
Then an MRI experiment is performed where a slice selection (RF nutation pulse with concurrent $\vec{G}ss$) is performed followed by one or more gradient lobes in the same direction as the slice selection gradient ($\vec{G}ss$ pulses).
Further assume that:
$\vec{G}$ is parallel to $\vec{G}ss$ whose maximum amplitude is assumed to be constant for all repetitions in the experiment; and
$\Delta B_0(t')$ is spatially invariant, or has a slowly spatially varying frequency associated with a change in $B_0$ (perhaps caused by eddy currents).
Also assume that:
$\varphi_0(i,j)$ represents phase offsets from residual $B_0$ inhomogeneities, or phase mismatch between the transmitter and the receiver, or residual system electronics currents.
$\Delta t$ is the sampling rate for the experiment (i.e., the time between acquired data sample points i and i+1, typically a few μs, e.g., 10 μs or less, e.g., 1 or 2 μs).
The phase of the NMR spins at an arbitrary point (i,j) during the ADC readout window is given by:

$$\phi_{i,j}(i\Delta t) = \phi_0(i,j) - \gamma \int_0^{\tau_{ij}} dt'\, G(t') \cdot z_j - \gamma \int_0^{\tau_{ij}} dt'\, \Delta B_0(t') \quad (1)$$
$$= \phi_0(i,j) + \phi_G(i\Delta t, z_j) + \phi_{B_0}(i\Delta t)$$

-continued $$= \phi_0(i, j) + A(i\Delta t) \cdot z_j + \phi_{B_0}(i\Delta t)$$

$$= \phi_0(i, j) + A(i) \cdot z_j + \phi_{B_0}(i)$$

where γ=the nuclear gyromagnetic ratio, $$A(i) = -\gamma \int_0^{i\Delta t} dt' G(t') \qquad (2)$$

and $$\varphi B_0(i) = -\gamma \int_0^{i\Delta t} dt' \Delta B_0(t') \qquad (3)$$

Unfortunately, none of these values are known, but we can make some reasonable assumptions:

$\Delta B_0(x,t')$ is the same for all experiments as long as $G(t')$ is the same, and TR is longer than the longest time constant of interest—for example, if time constants are 100 μs or so, a recovery time of a few milliseconds suffices. However, for long-term eddy current magnetic field mapping, the time constants can be orders of magnitude longer (e.g., 100 ms or so). Thus, the required TR range changes as needed for a given circumstance as those in the art will appreciate.

$$G(t') = G_{ideal}(t') + G_{other}(t') + O(G^2(t'))$$

where $G_{other}(t')$ can be generated by eddy currents, or gradient amplifier feedback, or anything else;

$O(G^2(t'))$ is a second (and/or higher order) component which can be ignored, although it might be possible to measure such too if desired; and $B_0(x,t')$ varies slowly relative to $G(t')$ as a function of position, and is not expected to be linear. Note this assumption on $B_0$ is scattered throughout prior k-space sampling papers, and found to be true in all of them.

Since the relationship of the phase between any two successive points i−1,i is known, from this difference one can directly measure G (for the Δt time period between sampling times i):

$$\Delta \phi_{i, i-1, j}(i\Delta t) = -\gamma \frac{G_i - G_{i-1}}{2} \Delta t z_j \qquad (4)$$

$$= \frac{-\gamma \Delta t}{2}(G_i + G_{i-1})z_j$$

where over a short time period $\varphi_{B_0}(i)$ is assumed to be a constant.

Since the measurement of the phase between just two points could lead to erroneous values of G, it is preferable to find the slope of the phase difference between several slices. By fitting for the slope, the phase contributions from background sources of phase ($\varphi_{B_0}(i)$) is eliminated. For each $i_0$, the following analysis can be performed to find G(iΔt):

$$\text{Slope}(\Delta \phi_{i_0, j}(i_0 \Delta t))(z) = -\gamma \frac{G_i + G_{i-1}}{2} \Delta t \quad \text{or} \qquad (5)$$

$$(G_i + G_{i-1}) = \frac{2 \cdot \text{Slope}(\Delta \phi_{i_0, j}(i_0 \Delta t))}{\gamma \Delta t} \qquad (6)$$

Figure 2:
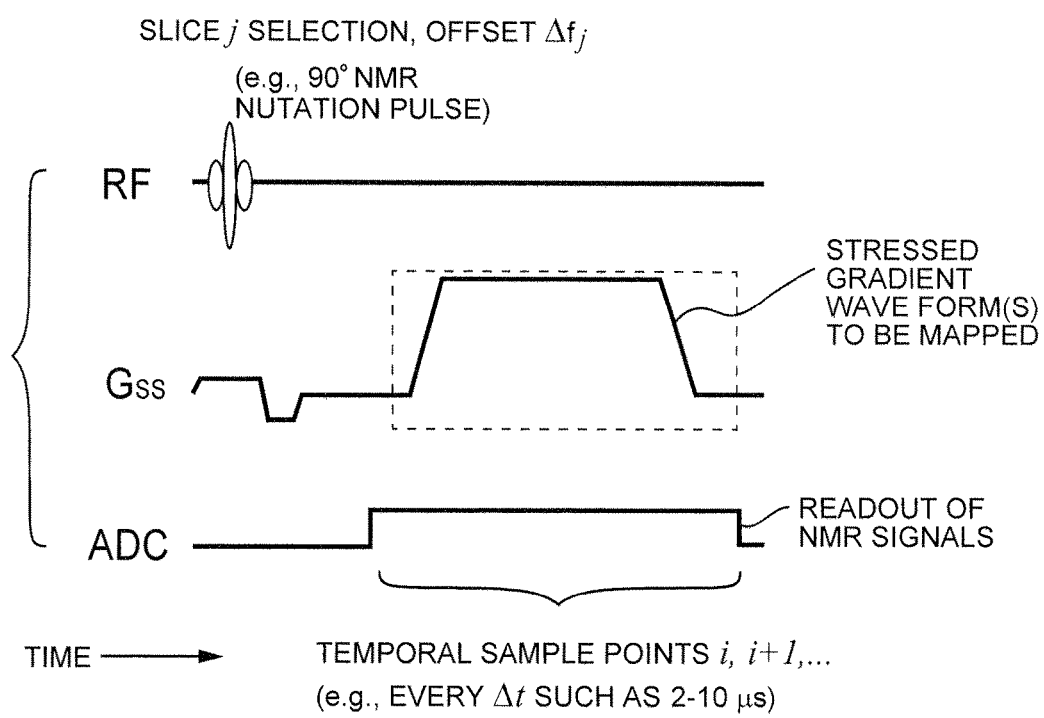
FIG. 2 is a first example pulse sequence diagram in accordance with one or more embodiments.

FIG. 2 illustrates a pulse sequence diagram for an example method. For any given slice j, a corresponding frequency offset RF nutation pulse (e.g., 90°, although any nutation angle may be used) is applied concurrently with a slice select gradient pulse so as to nutate NMR nuclei within that selected slice. Subsequent slices j can be very accurately and precisely selected by suitable changes in the precisely determined offset frequency of the RF nutation pulse.

As also shown in FIG. 2, stressed gradient waveform(s) (e.g., one or as many more pulses as may be desired) to be mapped is/are subsequently applied in the same direction as the slice select gradient. An ADC sampling window is opened so as to encompass the stressed gradient waveform portions for which analysis is desired (e.g., especially non-linear corners and the like). Temporal sample points i are then taken frequently (e.g., every two microseconds).

The stressed gradient waveform encompassed by the dotted box may be changed to an arbitrary shape, including bipolar, sinusoidal, or more complex gradient waveform(s). The example method does not restrict the shape of the gradient that is to be measured. Only the frequency offset of the transmit RF pulse is modified in each repetition of the process to get the required phase information for measuring the gradient magnetic field actually experienced by NMR nuclei.

Figure 4:
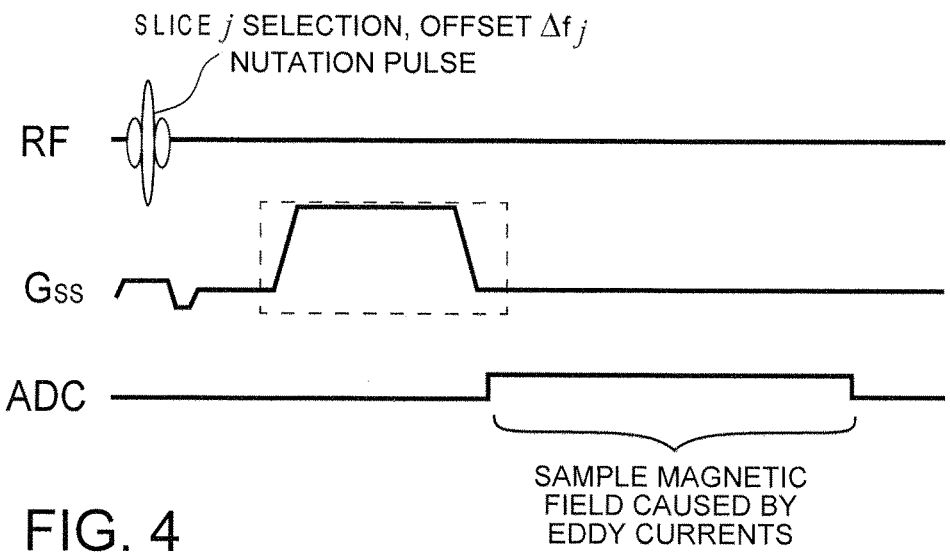
FIG. 4 is a second example pulse sequence diagram in accordance with one or more embodiments.

Essentially the same methodology may also be used to study eddy currents by direct measurement. For example, as depicted in FIG. 4, the ADC sampling window may be opened after application of the stressed gradient (or the ADC sampling window may merely be extended beyond the stressed gradient) to measure residual magnetic fields generated by eddy currents caused by the applied gradient pulse(s).

Figure 3:
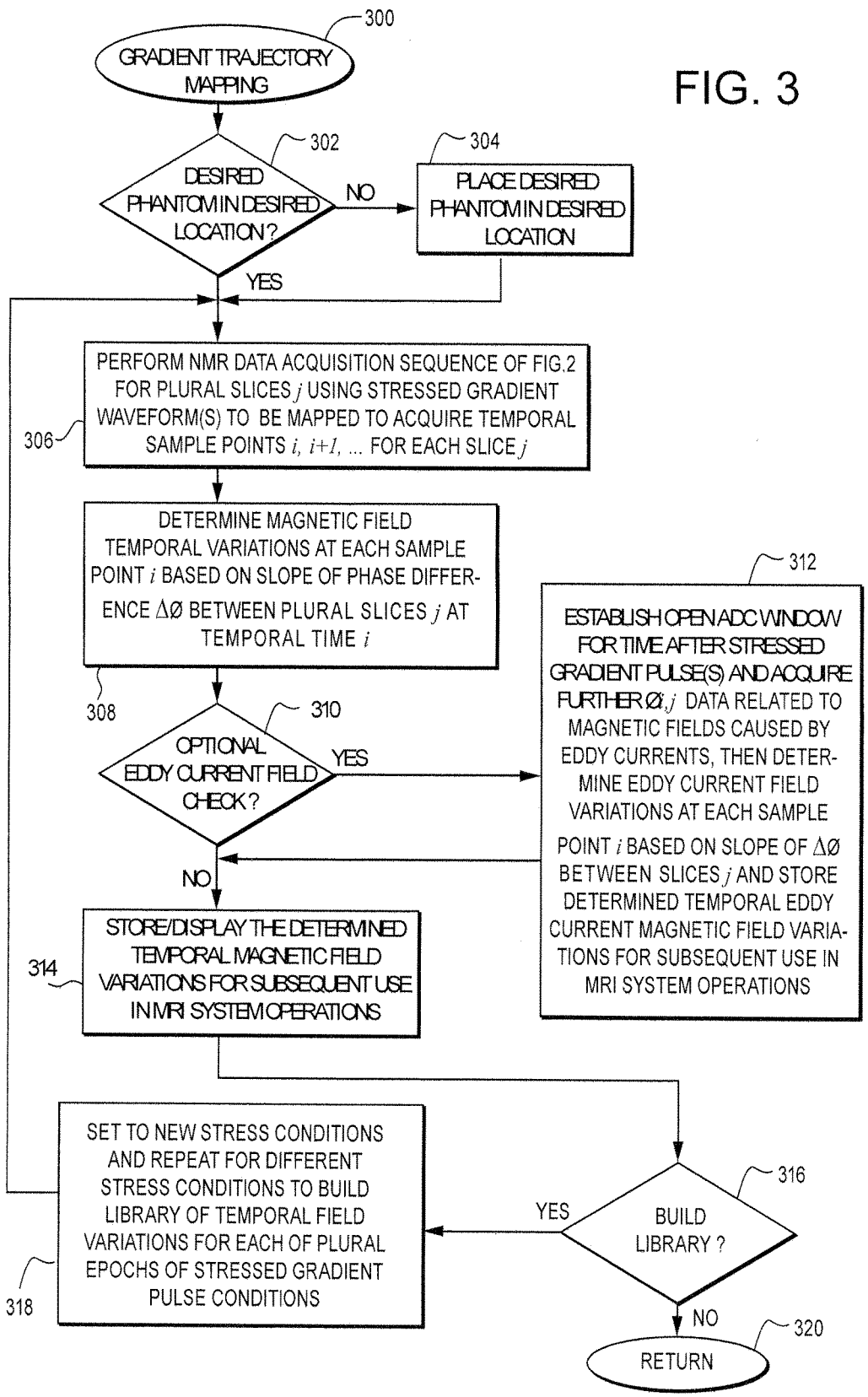
FIG. 3 provides a flow chart of computer program code structure for implementing one or more embodiments.

An example gradient trajectory mapping process is depicted in FIG. 3. Here, computer program code structure may be entered (e.g., from an overarching operating system or the like) at 300. A check is made at decision point 302 to see if a desired phantom is in the desired location in the image volume. If not, then the desired phantom is placed in the desired location at step 304. The control passes to block 306 where NMR data acquisition sequences are performed for plural slices j using stressed gradient waveform(s) to be mapped so as to acquire temporal sample points i, i+1, ... for each slice j.

Thereafter, at step 308, magnetic field temporal variations are determined at each sample point i based on the slope of phase differences Δφ between plural slices j and temporal times i.

At decision point 310, an option is provided for checking eddy current fields. If the option is selected, then at step 312 the ADC window is opened (or maintained open) after a stressed gradient pulse (or pulses) to acquire further phase data related to magnetic fields caused by eddy currents. The eddy current field variations are then determined at each sample point i based on the slope of phase changes between slices j and such are stored as temporal eddy current magnetic field variations for subsequent use in MRI system operations.

The determined temporal magnetic field variations are stored and/or displayed at step 314 for subsequent use in MRI system operations.

At decision point 316, it is possible to choose to build a library of stored representations of the determined temporal magnetic field variations for different sets of stressed gradient pulse conditions. If this option is taken, then control is passed to block 318 which resets the system for different stress conditions so as to build a library of temporal field variations for one or more stressed gradient pulse conditions. After that, control is returned back to block 306 so as to store/display determined temporal magnetic field variations for yet another set of stress conditions.

Finally, the gradient trajectory mapping process of FIG. 3 is exited at 320 by returning control to the calling program.

Figure 5:
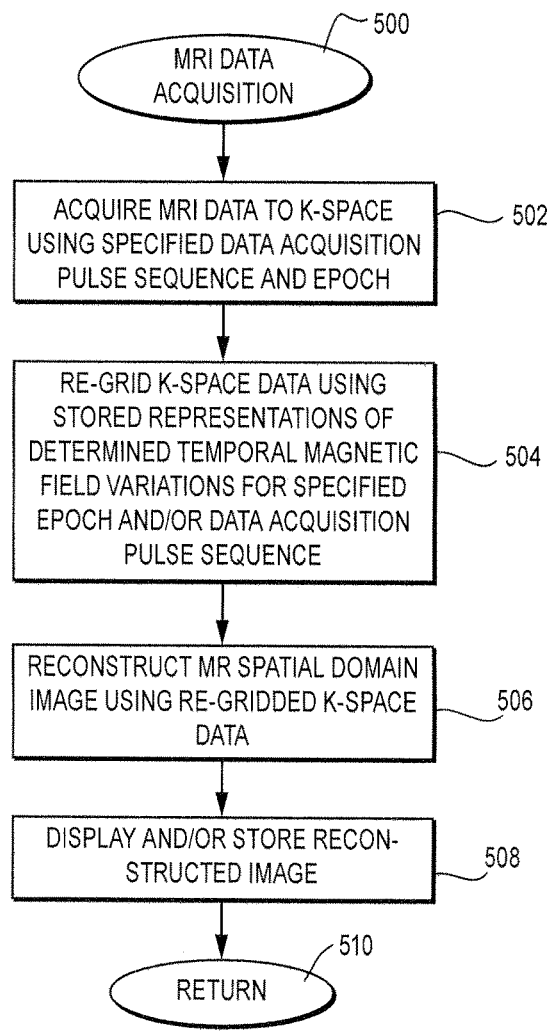
FIG. 5 is a flow chart of computer program code structure for re-gridding and reconstructing MR images using stored representations of determined temporal magnetic field variations from FIG. 3.

FIG. 5 depicts one possible subsequent use for stored representations of the determined temporal magnetic field variations as would result from the process of FIG. 3. Here, an MRI data acquisition process is entered at 500 (e.g., again from an overarching control operating system or the like). At block 502, MRI data is acquired for k-space using a specified data acquisition pulse sequence. Then, at block 504, the acquired k-space data is re-gridded using stored representations of determined temporal magnetic field variations. As will be appreciated, if eddy current representations are also available, then these can be used as well in the re-gridding process.

At step 506, an MR image in the spatial domain is reconstructed using the re-gridded k-space data from step 504. At step 508, the reconstructed image in the spatial domain is displayed and/or stored for further use will be understood as those in the art.

The MRI data acquisition sequence of FIG. 5 may then be exited at 510 by returning control to the calling program.

The direct measurement methods of FIGS. 2 and 4 work well at low gradient amplitudes and are also suitable for measuring even residual gradients (e.g., eddy currents).

The Atkinson method is similar in structure to this method. However, in the Atkinson method, the gradient amplitude is sequentially incremented. Thus, the gradient system conditions (slew, amplitude, power and current duty) are not constant throughout the experiment. Data acquired across a broad range of the gradient system output is combined in the solution for the gradient field measurement. Therefore, the gradient measurement is not representative of a fixed set of gradient system stress conditions.

An advantage of the example method herein described is its ability to interrogate gradient system performance for a fixed set of stress conditions. In the experiment, the gradient pulse waveshape and amplitude is identical for all acquired data. Thus, any non-ideal effects caused by gradient system conditions are consistent in all data. Therefore, this method can provide a means to concentrate on system performance in response to a specific set (or sets) of stress conditions.

This method can also be used to probe G(t) in different spatial regions of the magnet. The example embodiment permits piecewise spatially localized analysis of the MRI system (e.g., the phantom may be placed in the middle of the magnet or along any axis to see if the signal responses behave differently).

In the above example, an MRI data acquisition sequence includes a gradient waveform (one or more gradient pulses) played out along the slice selection direction and repeated at varying slice positions. Evaluation of the phase variation of the sample points as a function of slice position is then used to infer the field gradient at each acquired pixel/voxel. Primary phase analysis can be linear; hence, robust gradient measurements can be made. Measurements can be made at the iso-center of the magnet or off the iso-center around each axis using an appropriate frequency offset. This allows for different regions of the imaging volume to be studied. Furthermore, no specific gradient waveform assumptions are required. Still further, the polarity of the responses can be studied by using positive amplitude gradient lobes or, alternatively, using negative amplitude gradient lobes during the experiment.

The example embodiment was performed using a standard phantom positioned at the appropriate location within the imaging volume to be studied. For example, a 10 cm cube of acrylic filled with mineral oil or the like may be an appropriate phantom. However, almost any phantom can be used so long as it provides measurable NMR signal responses. A solid acrylic phantom might as also be used, for example.

The example method provides several advantages over prior art approaches to this problem. For example, some prior methods do not produce such high resolution data acquisition under specific stress conditions. Furthermore, these advantages are realized without requiring special hardware or phantom configurations. Some prior approaches requiring multiple gradient levels to be aggregated actually mask variations as a function of system stress.

Prior methods are not believed to have addressed obtaining data acquisition under plural specified stress conditions. For example, where the gradient field is determined at a specific performance or stress level. Or, for example, to make it possible to isolate $\varphi_0$ and $\Delta B_0$ pulses. Or, for example, by moving a phantom and/or modifying slice select frequency making it possible to study spatially localized variations of gradient trajectory. However, the above example embodiments provide all these things.

The method described above provides high resolution measurements of gradient waveforms. Those measurements are made under specific stress or system conditions such as high peak power and slew rate or peak power output or the like. Specific conditions such as positive versus negative gradient polarity can also be studied. The above can also be used to study complex sinusoidal or other gradient waveforms.

In the absence of applied gradient G(t'), the MRI system is still likely to be burdened with residual linear and higher order magnetic field variations, in other words, $B_0(\vec{x}) \neq B_0$. This condition is especially true when parameterizing a volume away from iso-center.

In this instance, the magnetic field of the system may be represented by:

$$B_0(\vec{x}) = B_0 + G_0(\vec{x}) + O(G_0^2(\vec{x}))$$

Measurement of the gradient G(t') will include the residual background fields:

$$G_0(\vec{x}) + O(G_0^2(\vec{x})).$$

In order to prevent biasing gradient measures, the residual fields must be accurately measured, their source identified, and their effect removed from subsequent measurements. This may be accomplished by making measurements in the absence of the applied magnetic field gradient (G(t')=0) to establish and remove the effects of $$G_0(\vec{x}) + O(G_0^2(\vec{x})).$$

Figure 6:
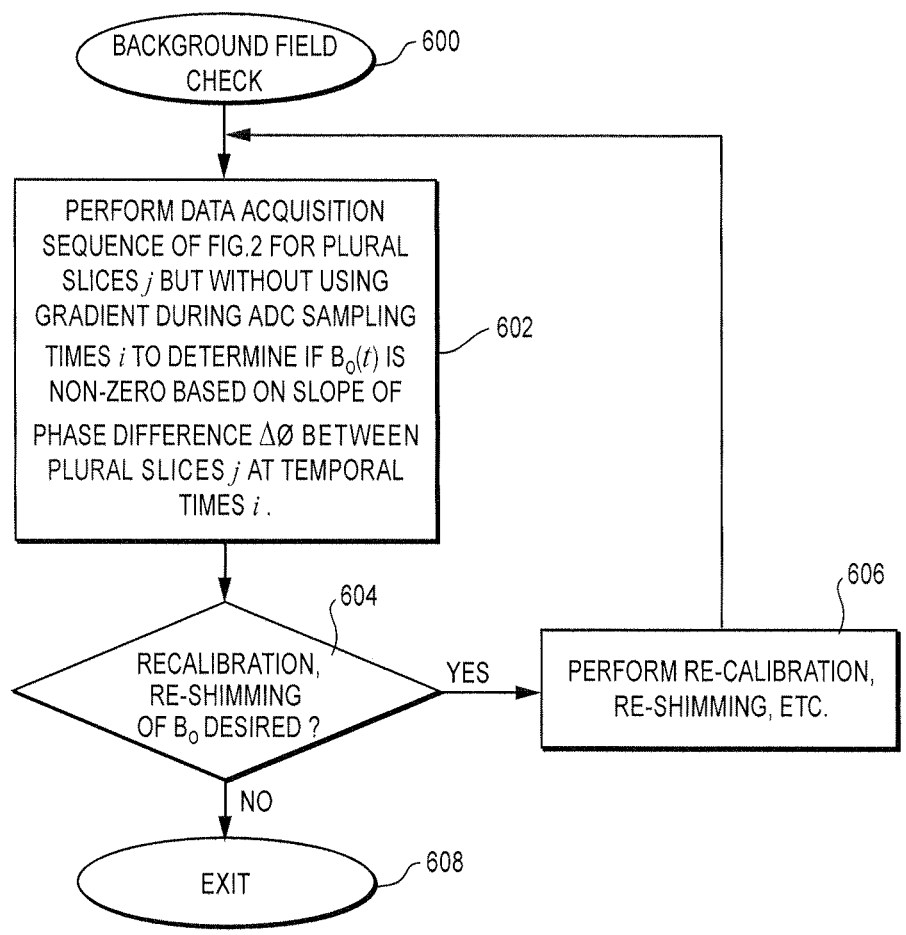
FIG. 6 is a flow chart of computer program code structure for performing an optional background magnetic field check using the data acquisition sequence of FIG. 2, but without applying any gradient waveform to be measured during an ADC sampling window.

An optional background field check routine may be entered at FIG. 6, block 600 (e.g., from an overarching operating system or the like). Then, at block 602, the data acquisition sequence of FIG. 2 is performed for plural slices j, but without using any applied gradient waveform to be measured during the ADC sampling times i. Hopefully, the determined $B_0(t)$ will exhibit zero slope between plural slices j. If this is not the case, then an option is presented at decision point 604 to recalibrate, re-shim, etc. If this option is taken, then the desired re-calibration, re-shimming, etc., is performed at block 606 before the background check is re-performed at block 602. Exit from the background check routine is performed at 608.

While certain embodiments have been described, these embodiments have been presented by way of example only and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) system comprising:

an assembly of gantry components including static and gradient magnetic field generators and at least one radio frequency (RF) coil defining an imaging volume;

an MRI control system, connected to control said gantry components, including at least one RF transmitter, at least one RF receiver and computer control circuits configured to effect specified MRI data acquisition sequences of RF and gradient magnetic pulses which acquire, from an object located within said imaging volume, RF nuclear magnetic resonance (NMR) spin responses emanating from different spatially located volumes of NMR nuclei respectively corresponding to different positions in k-space as a function of a magnetic field experienced by the nuclei;

said computer control circuits being configured to effect:

(A) for each of a series of slices j, a data acquisition sequence using (a) RF and slice select magnetic gradient pulses followed by (b) at least one magnetic gradient pulse to be analyzed, said magnetic gradient pulse to be analyzed having a same magnitude for each slice and being in a same direction as said slice select magnetic gradient pulse, located at least partly within an analog-to-digital converter (ADC) window providing successive temporal samples i of NMR phase responses $\varphi_{i,j}$, wherein all magnetic gradient pulses to be analyzed in the data acquisition sequence have the same magnitude, (B) determining magnetic field temporal variations at each sample point i based on the slope of the phase difference $\Delta\varphi$ between plural slices j at temporal sampling time i, by comparing phase measurements across plural slices and across plural temporal sampling times where said same magnitude magnetic gradient pulse to be analyzed causes detected phase differences, and (C) storing representations of the determined temporal magnetic field variations for subsequent use in MRI system operations.

2. The MRI system as in claim 1, wherein said computer control circuits are further configured to:

(D) establish an open ADC window for a further period after said at least one magnetic gradient pulse to be analyzed and thereby acquire further NMR phase responses $\varphi_{i,j}$ related to magnetic fields caused by eddy currents, (E) determine eddy current magnetic field temporal variations at each sample point i based on the slope of the phase difference $\Delta\varphi$ between plural slices j at temporal time i during said further period, and (F) store the determined temporal eddy current magnetic field variations for subsequent use in MRI system operations.

3. The MRI system as in claim 1, wherein said computer control circuits are further configured to effect measurement of MRI system background magnetic fields by:

for each of a series of slices m, effecting a data acquisition sequence using RF and slice select magnetic gradient pulses followed by an ADC window providing successive background temporal samples n of NMR phase responses $\varphi_{n,m}$, but without occurrence of a magnetic gradient pulse during temporal sample acquisition;

determining background magnetic field temporal variations at each background sample point n based on the slope of the phase difference between plural slices m at background temporal sampling time n; and storing the determined background magnetic field temporal variations for subsequent use in MRI system operations.

4. The MRI system as in claim 1, wherein said computer control circuits are configured to:

(D) store said determined temporal magnetic field variations for each of plural predetermined magnetic gradient pulse conditions associated with respectively corresponding MRI diagnostic data acquisition sequences in an MRI library of possible MRI diagnostic data acquisition sequences.

5. The MRI system as in claim 1, wherein said computer control circuits are configured to:

(D) re-grid acquired k-space diagnostic MRI data, acquired while using said magnetic gradient pulse to be analyzed, in accordance with said determined temporal magnetic field variations for the magnetic gradient pulse to be analyzed, rather than in accordance with theoretical assumed temporal magnetic field variations of the magnetic gradient pulse to be analyzed, and (E) re-construct the resulting re-gridded k-space diagnostic MRI data into a diagnostic image in the spatial domain.

6. The MRI system as in claim 1, wherein said computer control circuits are configured to determine said temporal magnetic field variations with a temporal resolution equal to the sampling rate of the ADC temporal samples i.

7. The MRI system as in claim 1, wherein said computer control circuits are configured to determine said temporal magnetic field variations without making any assumption as to the shape of expected temporal magnetic field variations to be determined.

8. The MRI system as in claim 1, wherein said data acquisition sequence is performed while a phantom object is located at a predetermined position within said image volume.

9. The MRI system as in claim 1, wherein said magnetic gradient pulse to be analyzed is subjected to at least one of the following conditions: a specified peak power gradient amplifier output level, a specified gradient amplifier slew rate, a specified gradient amplifier duty cycle over a first time period, a specified gradient amplifier duty cycle over a first and a second time period, and a specified gradient amplifier temperature.

10. The MRI system as in claim 1, wherein said computer control circuits are configured to create a model of MRI system operation based on said determined temporal magnetic field variations as a function of varied operating parameters.

11. A magnetic resonance imaging (MRI) method comprising:

controlling an assembly of gantry components including static and gradient magnetic field generators and at least one radio frequency (RF) coil defining an imaging volume, at least one RF transmitter, at least one RF receiver and computer control circuits configured to effect specified MRI data acquisition sequences of RF and gradient magnetic pulses which acquire, from an object located within said imaging volume, RF nuclear magnetic resonance (NMR) spin responses emanating from different spatially located volumes of NMR nuclei respectively corresponding to different positions in k-space, as a function of a magnetic field experienced by the nuclei, to effect:

(A) for each of a series of slices j, a data acquisition sequence using (a) RF and slice select magnetic gradient pulses followed by (b) at least one magnetic gradient pulse to be analyzed, said magnetic gradient pulse to be analyzed having a same magnitude for each slice j and being in a same direction as said slice select magnetic gradient pulse, located at least partly within an analog-to-digital converter (ADC) window providing successive temporal samples i of NMR phase responses $\varphi_{i,j}$, wherein all magnetic gradient pulses to be analyzed in the data acquisition sequence have the same magnitude, (B) determining magnetic field temporal variations at each sample point i based on the slope of the phase difference $\Delta\varphi$ between plural slices j at temporal sampling time i, by comparing phase measurements across plural slices and across plural temporal sampling times where said same magnitude magnetic gradient pulse to be analyzed causes detected phase differences, and (C) storing representations of the determined temporal magnetic field variations for subsequent use in MRI system operations.

12. The MRI method as in claim 11, further comprising:
(D) establishing an open ADC window for a further period after said at least one magnetic gradient pulse to be analyzed and thereby acquire further NMR phase responses $\varphi_{i,j}$ related to magnetic fields caused by eddy currents,
(E) determining eddy current magnetic field temporal variations at each sample point i based on the slope of the phase difference $\Delta\varphi$ between plural slices j at temporal time i during said further period, and
(F) storing the determined temporal eddy current magnetic field variations for subsequent use in MRI system operations.

13. The MRI method as in claim 11 further comprising measurement of MRI system background magnetic fields by:
for each of a series of slices m, effecting a data acquisition sequence using RF and slice select magnetic gradient pulses followed by an ADC window providing successive background temporal samples n of NMR phase responses $\varphi_{n,m}$, but without occurrence of a magnetic gradient pulse during temporal sample acquisition;
determining background magnetic field temporal variations at each background sample point n based on the slope of the phase difference between plural slices m at background temporal sampling time n; and
storing the determined background magnetic field temporal variations for subsequent use in MRI system operations.

14. The MRI method as in claim 11, further comprising:
(D) storing said determined temporal magnetic field variations for each of plural predetermined magnetic gradient pulse conditions associated with respectively corresponding MRI diagnostic data acquisition sequences in an MRI library of possible MRI diagnostic data acquisition sequences.

15. The MRI method as in claim 11, further comprising:
(D) re-gridding acquired k-space diagnostic MRI data, acquired while using said magnetic gradient pulse to be analyzed, in accordance with said determined temporal magnetic field variations for the magnetic gradient pulse to be analyzed, rather than in accordance with theoretical assumed temporal magnetic field variations of the magnetic gradient pulse to be analyzed, and
(E) re-constructing the resulting re-gridded k-space diagnostic MRI data into a diagnostic image in the spatial domain.

16. The MRI method as in claim 11, wherein said temporal magnetic field variations are determined with a temporal resolution equal to the sampling rate of the ADC temporal samples i.

17. The MRI method as in claim 11, wherein said temporal magnetic field variations are determined without making any assumption as to the shape of expected temporal magnetic field variations to be determined.

18. The MRI method as in claim 11, wherein said data acquisition sequence is performed while a phantom object is located at a predetermined position within said image volume.

19. The MRI method as in claim 11, wherein said magnetic gradient pulse to be analyzed is subjected to at least one of the following conditions: a specified peak power gradient amplifier output level, a specified gradient amplifier slew rate, a specified gradient amplifier duty cycle over a first time period, a specified gradient amplifier duty cycle over a first and a second time period, and a specified gradient amplifier temperature.

20. The MRI method as in claim 11, further comprising creating a model of MRI system operation based on said determined temporal magnetic field variations as a function of varied operating parameters.

21. The MRI system as in claim 1 wherein said computer control circuits are configured to characterize performance of the gradient magnetic field generator for said same magnitude of magnetic gradient pulse output from the gradient magnetic field generator.

22. The MRI method as in claim 11 further comprising characterizing performance of the gradient magnetic field generator for said same magnitude of magnetic gradient pulse output from the gradient magnetic field generator.

* * * * *